United States Patent
Wan et al.

(10) Patent No.: US 7,206,231 B2
(45) Date of Patent: *Apr. 17, 2007

(54) SYSTEM FOR PROGRAMMING NON-VOLATILE MEMORY WITH SELF-ADJUSTING MAXIMUM PROGRAM LOOP

(75) Inventors: Jun Wan, Sunnyvale, CA (US); Jeffrey W. Lutze, San Jose, CA (US)

(73) Assignee: Sandisk Corporation, Milpitas, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/394,441

(22) Filed: Mar. 31, 2006

(65) Prior Publication Data

US 2007/0025156 A1 Feb. 1, 2007

Related U.S. Application Data

(63) Continuation of application No. 11/194,827, filed on Aug. 1, 2005, now Pat. No. 7,023,737.

(51) Int. Cl.
*G11C 16/04* (2006.01)
(52) U.S. Cl. .............................. 365/185.22; 365/185.28
(58) Field of Classification Search ........... 365/185.03, 365/185.17, 185.22, 185.28
See application file for complete search history.

(56) References Cited

U.S. PATENT DOCUMENTS

| | | | |
|---|---|---|---|
| 5,386,422 A | 1/1995 | Endoh et al. | |
| 5,570,315 A | 10/1996 | Tanaka et al. | |
| 5,774,397 A | 6/1998 | Endoh et al. | |
| 5,801,989 A | 9/1998 | Lee et al. | |
| 6,000,843 A | 12/1999 | Sawada | |
| 6,046,935 A | 4/2000 | Takeuchi et al. | |
| 6,222,762 B1 | 4/2001 | Guterman et al. | |
| 6,442,074 B1 * | 8/2002 | Hamilton et al. | 365/185.29 |
| 6,456,528 B1 | 9/2002 | Chen | |
| 6,522,580 B2 | 2/2003 | Chen et al. | |
| 6,859,397 B2 | 2/2005 | Lutze et al. | |
| 6,888,758 B1 | 5/2005 | Hemink et al. | |
| 6,967,867 B2 | 11/2005 | Hamaguchi | |
| 2003/0112663 A1 | 6/2003 | Quader et al. | |
| 2004/0109362 A1 | 6/2004 | Gongwer et al. | |
| 2004/0255090 A1 | 12/2004 | Guterman et al. | |
| 2005/0024939 A1 | 2/2005 | Chen et al. | |
| 2005/0083735 A1 | 4/2005 | Chen et al. | |

OTHER PUBLICATIONS

Chan et al., "A True Single-Transistor Oxide-Nitride-Oxide EEPROM Device," IEEE Electron Device Letters, vol. EDL-8, No. 3, Mar. 1987, pp. 93-95.

(Continued)

*Primary Examiner*—Vu A. Le
(74) *Attorney, Agent, or Firm*—Vierra Magen Marcus & DeNiro LLP

(57) ABSTRACT

The maximum allowable number of voltage programming pulses to program memory elements of a non-volatile memory device is adjusted to account for changes in the memory elements which occur over time. Programming pulses are applied until the threshold voltage of one or more memory elements reaches a certain verify level, after which a defined maximum number of additional pulses may be applied to other memory elements to allow them to also reach associated target threshold voltage levels. The technique enforces a maximum allowable number of programming pulses that can change over time as the memory is cycled.

21 Claims, 9 Drawing Sheets

OTHER PUBLICATIONS

Nozaki et al., "A 1-Mb EEPROM with MONOS Memory Cell for Semiconductor Disk Application," IEEE Journal of Solid-State Circuits, vol. 26, No. 4, Apr. 1991, pp. 497-501.

"Nonvolatile Semiconductor Memory Technology," section 1.2, edited by William D. Brown and Joe E. Brewer, IEEE Press, 1998, pp. 9-23.

Eitan et al., "NROM: A Novel Localized Trapping, 2-Bit Nonvolatile Memory Cell," IEEE Electron Device Letters, vol. 21, No. 11, Nov. 2000, pp. 543-545.

U.S. Patent Application titled "Pipelined Programming of Non-Volatile Memories Using Early Data," U.S. Appl. No. 11/013,125, filed Dec. 14, 2004 by inventors Sergy Anatolievich Gorobets and Yan Li.

U.S. Appl. No. 11/099,133, titled "Compensating For Coupling During Read Operations Of Non-Volatile Memory," filed Apr. 5, 2005.

International Search Report for PCT/US2006/029047, Nov. 24, 2006.

* cited by examiner

Fixed pulse limit (FPL) – Max. allowed number of Vpgm pulses

|  | Typical Program Pulse Count | | | Initial Vpgm | Typical Tprogram | Typical Soft Program Pulses |
|---|---|---|---|---|---|---|
|  | Lower Page | Upper Page | Full Sequence |  |  |  |
| Fresh | 13 | 18 | 22 | 16.0V | 800 usec | 16 |
| 10k Cycles | 10 | 15 | 19 | 16.0V | 650 usec | 10 |

SYSTEM FOR PROGRAMMING NON-VOLATILE MEMORY WITH SELF-ADJUSTING MAXIMUM PROGRAM LOOP

CROSS-REFERENCE TO RELATED APPLICATIONS

This application is a continuation of U.S. patent application Ser. No. 11/194,827, titled "System For Programming Non-Volatile Memory With Self-Adjusting Maximum Program Loop", by Jun Wan and Jeffrey W. Lutze, filed on Aug. 1, 2005, issued as U.S. Pat. No. 7,023,737 on Apr. 4, 2006, incorporated herein by reference in its entirety.

This application is related to co-pending, commonly assigned U.S. patent application Ser. No. 11/194,439, titled "Method For Programming Non-Volatile Memory With Self-Adjusting Maximum Program Loop", by Jun Wan and Jeffrey W. Lutze, filed on Aug. 1, 2005, incorporated herein by reference in its entirety.

BACKGROUND OF THE INVENTION

1. Field of the Invention

The present invention relates to programming non-volatile memory.

2. Description of the Related Art

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM.

Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

When programming an EEPROM or flash memory device, such as a NAND flash memory device, typically a program voltage is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is in a programmed state. More information about such programming can be found in U.S. Pat. No. 6,859,397, titled "Source Side Self Boosting Technique For Non-Volatile Memory," and in U.S. Patent Application Publication 2005/0024939, titled "Detecting Over Programmed Memory," filed on Jul. 29, 2003; both of which are incorporated herein by reference in their entirety.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, the program voltage applied to the control gate during a program operation is applied as a series of pulses. In one possible approach, the magnitude of the pulses is increased with each successive pulse by a predetermined step size, e.g., 0.2–0.4 V. FIG. 1 shows a program voltage signal $V_{pgm}$ that can be applied to the control gates (or, in some cases, steering gates) of flash memory elements. $V_{pgm}$ includes a series of pulses that increase in magnitude over time. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to allow a determination of whether the element has reached its data-associated verify level. For example, a multi-state memory element capable of storing data in four states may need to perform verify operations for three compare points.

If an element does not reach the desired program level after a given number of pulses, which is conventionally fixed, an error condition is declared. The choice of the magnitude of program voltage $V_{pgm}$, including an initial value, the voltage step size, if applicable, and the maximum number of pulses to apply before declaring an error condition, involves a compromise among various factors. In particular, if the initial value or the step size is too large, some memory elements may be over-programmed, resulting in an inaccurate threshold voltage, while longer programming times will result if the initial value or the step size is too small. Typically, users of non-volatile memory desire that the memory program quickly. Furthermore, the number of pulses needed to program different memory elements to a desired state can differ. Slower memory elements will need more pulses while faster memory elements will need fewer pulses. In order to have a sufficient margin or cushion so that the die-sort yield is acceptable, a relatively large number of $V_{pgm}$ pulses is typically allowed. For example, in 90 nm devices, although most upper pages in multi-state memory element devices can be programmed within eighteen pulses, the maximum allowed number of pulses may be set at, e.g., twenty-four, to provide a margin of six pulses. However, if one normal page of memory elements has several slow elements or has one bad column, the entire page will keep programming until the maximum number of pulses has occurred.

As a result, some elements along the same word line as the slow element or the bad column could be disturbed. Moreover, this scenario is more severe for cycled devices, which have undergone many programming cycles, than for fresh devices, which have not been significantly used, because the cycled devices are faster than fresh devices due to charge trapping. In particular, as a non-volatile memory device undergoes many programming cycles, charge becomes trapped in the insulator or dielectric between the floating gate and the channel region. This trapping of charge shifts the threshold voltage to a higher level, which allows the memory element to program quicker while also making it harder to erase the charge in the element. If the magnitude of the program signal is set too high, even though it does not result in over programming of a fresh device, as that device becomes more heavily used, that device may experience over programming. Thus, new devices will have their program voltage set low enough to avoid over programming when the device is older. This lowering of the magnitude of the program voltage will reduce the speed at which the fresh device programs data.

Consequently, an excessive number of program pulses may be applied to the normal elements in the cycled device. The problem is exacerbated by the fact that cycled devices have more bad columns than fresh devices. While it is possible to lower the number of $V_{pgm}$ pulses used before declaring an error condition, as mentioned, this reduces yield. For example, if the maximum number of program pulses is reduced from twenty-four to twenty-two, the die-sort yield is reduced by about 5%, which is generally considered to be unacceptable.

SUMMARY OF THE INVENTION

The present invention addresses the above and other issues by providing a system for adjusting the number of program voltage pulses that are applied to the elements in a non-volatile memory without increasing the incidence of errored elements, that is, elements that do not reach the desired voltage level within the maximum allowable number of pulses. To achieve this result, the number of allowed voltage pulses is adjusted so that it is changed for cycled memory devices relative to fresh memory devices.

In one embodiment, a non-volatile storage system includes at least a first non-volatile storage element, and at least a second non-volatile storage element, and one or more managing circuits in communication with the at least a first non-volatile storage element, and with the at least a second non-volatile storage element. The one or more managing circuits receive a request to program data, and, responsive to the request, program the at least a first non-volatile storage element to reach a first verify level using a series of voltage pulses, detect when the at least a first non-volatile storage element has reached the first verify level and, enforce, responsive to the detecting, a maximum allowable number of additional voltage pulses to be used in programming at least a second non-volatile storage element to reach a second verify level.

In another embodiment, a non-volatile storage system includes non-volatile storage elements, and one or more managing circuits in communication with the non-volatile storage elements. The one or more managing circuits receive a request to program data, and, responsive to the request, perform one or more initial program cycles for a set of the non-volatile storage elements until a first subset of the non-volatile storage elements has reached a first verify level, and perform one or more additional program cycles for the set of non-volatile storage elements subsequent to the first subset of the non-volatile storage elements reaching the first verify level, the one or more additional program cycles not to exceed a predefined maximum number of additional program cycles.

In another embodiment, a non-volatile storage system includes non-volatile storage elements and one or more managing circuits in communication with the non-volatile storage elements. The one or more managing circuits receive a request to program data, and, responsive to the request, perform one or more initial program cycles for a set of the non-volatile storage elements, determine that a first subset of the non-volatile storage elements has reached a first verify level, determine a number of initial program cycles performed when the first subset of the non-volatile storage elements has reached the first verify level, determine a maximum number of additional program cycles based on the number of initial program cycles, and perform one or more additional program cycles for the set of non-volatile storage elements subsequent to the first subset of the non-volatile storage elements reaching the first verify level, the one or more additional program cycles not to exceed a maximum number of additional program cycles.

DETAILED DESCRIPTION

Figure 2:
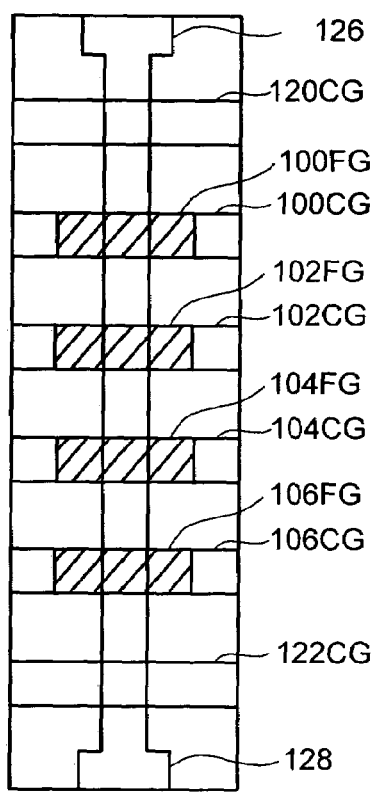
FIG. 2 is a top view of a NAND string.
Figure 3:
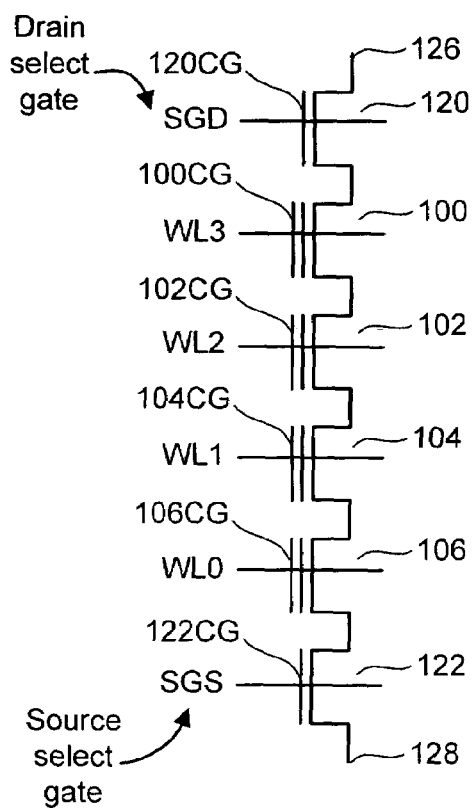
FIG. 3 is an equivalent circuit diagram of the NAND string of FIG. 2.

One example of a non-volatile memory system suitable for implementing the present invention uses the NAND flash memory structure, which includes arranging multiple transistors in series between two select gates. The transistors in series and the select gates are referred to as a NAND string. FIG. 2 is a top view showing one NAND string. FIG. 3 is an equivalent circuit thereof. The NAND string depicted in FIGS. 2 and 3 includes four transistors, 100, 102, 104 and 106, in series and sandwiched between a first select gate 120 and a second select gate 122. Select gate 120 connects the NAND string to bit line contact 126. Select gate 122 connects the NAND string to source line contact 128. Select gate 120 is controlled by applying the appropriate voltages to control gate 120CG. Select gate 122 is controlled by applying the appropriate voltages to control gate 122CG. Each of the transistors 100, 102, 104 and 106 has a control gate and a floating gate. Transistor 100 has control gate 100CG and floating gate 100FG. Transistor 102 includes control gate 102CG and floating gate 102FG. Transistor 104 includes control gate 104CG and floating gate 104FG. Transistor 106 includes a control gate 106CG and floating gate 106FG. Control gates 100CG, 102CG, 104CG and 106CG are connected to word lines WL3, WL2, WL1 and WL0, respectively. In one possible design, transistors 100, 102, 104 and 106 are each memory cells or elements. In other designs, the memory elements may include multiple transistors or may be different than those depicted in FIGS. 2 and 3. Select gate 120 is connected to select line SGD, while select gate 122 is connected to select line SGS.

Figure 4:
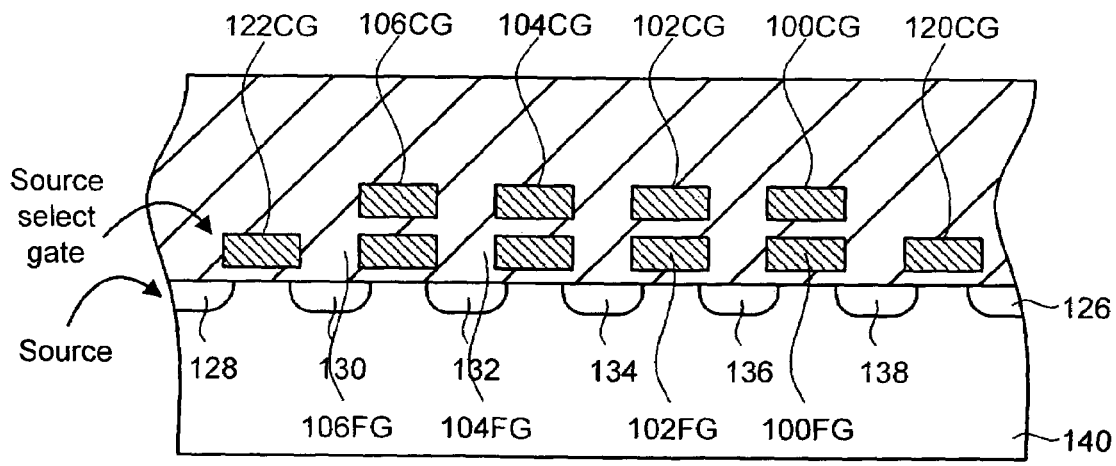
FIG. 4 is a cross-sectional view of the NAND string of FIG. 2.

FIG. 4 provides a cross-sectional view of the NAND string described above. The transistors of the NAND string are formed in p-well region 140. Each transistor includes a stacked gate structure that includes a control gate (100CG, 102CG, 104CG and 106CG) and a floating gate (100FG, 102FG, 104FG and 106FG). The floating gates are formed on the surface of the p-well on top of an oxide or other dielectric film. The control gate is above the floating gate, with an inter-polysilicon dielectric layer separating the control gate and floating gate. The control gates of the memory elements (100, 102, 104 and 106) form the word lines. N+ doped layers 130, 132, 134, 136 and 138 are shared between neighboring elements, whereby the elements are connected to one another in series to form the NAND string. These N+ doped layers form the source and drain of each of the elements. For example, N+ doped layer 130 serves as the drain of transistor 122 and the source for transistor 106, N+ doped layer 132 serves as the drain for transistor 106 and the source for transistor 104, N+ doped layer 134 serves as the drain for transistor 104 and the source for transistor 102, N+ doped layer 136 serves as the drain for transistor 102 and the source for transistor 100, and N+ doped layer 138 serves as the drain for transistor 100 and the source for transistor 120. N+ doped layer 126 connects to the bit line for the NAND string, while N+ doped layer 128 connects to a common source line for multiple NAND strings.

Note that although FIGS. 2–4 show four memory elements in the NAND string, the use of four transistors is provided only as an example. A NAND string used with the technology described herein can have less than four memory elements or more than four memory elements. For example, some NAND strings will include eight, sixteen, thirty-two, sixty-four or more memory elements. The discussion herein is not limited to any particular number of memory elements in a NAND string.

Each memory element can store data represented in analog or digital form. When storing one bit of digital data, the range of possible threshold voltages of the memory element is divided into two ranges, which are assigned logical data "1" and "0." In one example of a NAND-type flash memory, the voltage threshold is negative after the memory element is erased, in what may be defined as the logic "1" state. The threshold voltage is positive after a program operation, in what may be defined as the logic "0" state. When the threshold voltage is negative and a read is attempted by applying 0 V to the control gate, the memory element will turn on to indicate logic one is being stored. When the threshold voltage is positive and a read operation is attempted by applying 0 V to the control gate, the memory element will not turn on, which indicates that logic zero is stored.

A memory element can also store multiple states, thereby storing multiple bits of digital data. In the case of storing multiple states of data, the threshold voltage window is divided into the number of states. For example, if four states are used, there will be four threshold voltage ranges assigned to the data values "11," "10," "01," and "00." In one example of a NAND-type memory, the threshold voltage after an erase operation is negative and defined as "11." Positive threshold voltages are used for the states of "10," "01," and "00." In some implementations, the data values (e.g., logical states) are assigned to the threshold ranges using a Gray code assignment so that if the threshold voltage of a floating gate erroneously shifts to its neighboring physical state, only one bit will be affected. The specific relationship between the data programmed into the memory element and the threshold voltage ranges of the element depends upon the data encoding scheme adopted for the memory elements. For example, U.S. Pat. No. 6,222,762 and U.S. patent application Ser. No. 10/461,244, "Tracking Cells For A Memory System," filed on Jun. 13, 2003, and published as U.S. Patent Application Publication 2004/0255090 on Dec. 16, 2004, both of which are incorporated herein by reference in their entirety, describe various data encoding schemes for multi-state flash memory elements.

Relevant examples of NAND-type flash memories and their operation are provided in the following U.S. patents, each of which is incorporated herein by reference in its entirety: U.S. Pat. Nos. 5,386,422, 5,570,315, 5,774,397, 6,046,935, 6,456,528 and 6,522,580. Other types of non-volatile memory in addition to NAND flash memory can also be used with the present invention.

Another type of memory element useful in flash EEPROM systems is the charge trapping element, which utilizes a non-conductive dielectric material in place of a conductive floating gate to store charge in a non-volatile manner. Such an element is described in an article by Chan et al., "A True Single-Transistor Oxide-Nitride-Oxide EEPROM Device," IEEE Electron Device Letters, Vol. EDL-8, No. 3, March 1987, pp. 93–95. A triple layer dielectric formed of silicon oxide, silicon nitride and silicon oxide ("ONO") is sandwiched between a conductive control gate and a surface of a semi-conductive substrate above the memory element channel. The element is programmed by injecting electrons from the element channel into the nitride, where they are trapped and stored in a limited region. This stored charge then changes the threshold voltage of a portion of the channel of the element in a manner that is detectable. The element is erased by injecting hot holes into the nitride. See also Nozaki et al., "A 1-Mb EEPROM with MONOS Memory Cell for Semiconductor Disk Application," IEEE Journal of Solid-State Circuits, Vol. 26, No. 4, April 1991, pp. 497–501, which describes a similar element in a split-gate configuration where a doped polysilicon gate extends over a portion of the memory element channel to form a separate select transistor. The foregoing two articles are incorporated herein by reference in their entirety. The programming techniques mentioned in section 1.2 of "Nonvolatile Semiconductor Memory Technology," edited by William D. Brown and Joe E. Brewer, IEEE Press, 1998, incorporated herein by reference, are also described in that section to be applicable to dielectric charge-trapping devices. The memory elements described in this paragraph can also be used with the present invention. Thus, the technology described herein also applies to coupling between dielectric regions of different memory elements.

Another approach to storing two bits in each element has been described by Eitan et al., "NROM: A Novel Localized Trapping, 2-Bit Nonvolatile Memory Cell," IEEE Electron Device Letters, vol. 21, no. 11, November 2000, pp. 543–545, which describes an ONO dielectric layer that extends across the channel between source and drain diffusions. The charge for one data bit is localized in the dielectric layer adjacent to the drain, and the charge for the other data bit localized in the dielectric layer adjacent to the source. Multi-state data storage is obtained by separately reading binary states of the spatially separated charge storage regions within the dielectric. The memory elements described in this paragraph can also be used with the present invention.

Figure 5:
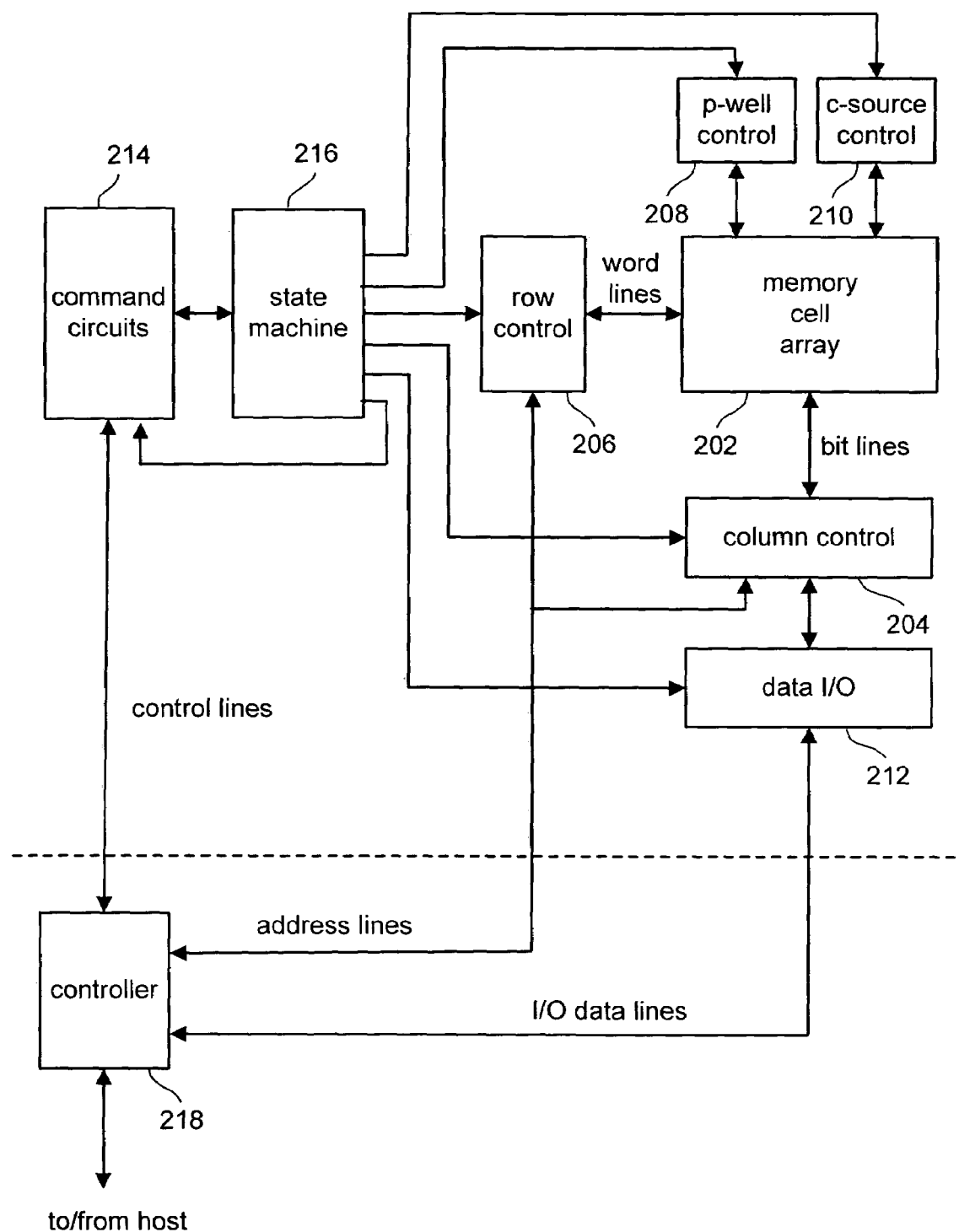
FIG. 5 is a block diagram of a non-volatile memory system.

FIG. 5 is a block diagram of one design of a flash memory system that can be used to implement the present invention. In this system, a memory element array 202 is controlled by a column control circuit 204, a row control circuit 206, a c-source control circuit 210 and a p-well control circuit 208. The column control circuit 204 is connected to the bit lines of memory element array 202 for reading data stored in the memory elements, for determining a state of the memory elements during a program operation, and for controlling potential levels of the bit lines (BLs) to promote or inhibit the programming. The row control circuit 206 is connected to the word lines to select one of the word lines, to apply read voltages, to apply program voltages and to apply an erase voltage. For example, program voltage levels used in EPROM and flash memory circuits are higher than the voltages normally used in memory circuits. They are often higher than the voltage supplied to the circuit. These higher voltages can be produced by a charge pump in row control circuit 206 (or elsewhere), which in one example essentially dumps charge into the capacitive word line to charge it to a higher voltage. The charge pump receives an input at a voltage $V_{in}$ and provides an output at a higher voltage $V_{out}$ by boosting the input voltage progressively in a series of voltage multiplier stages. The voltage output is supplied to a load, for example, the word line of an EPROM memory circuit. In some implementations, there is a feedback signal from the load to the charge pump. The conventional prior art pump turns off in response to a signal indicating that the load has reached a predetermined voltage. Alternatively, a shunt is used to prevent overcharging once the load reaches the predetermined voltage. However, this consumes more power and is undesirable in low power applications. More information about charge pumps can be found in U.S. Pat. No. 6,734,718, incorporated herein by reference in its entirety.

The c-source control circuit 210 controls a common source line (labeled as "C-source" in FIG. 6) connected to the memory elements. The p-well control circuit 208 controls the p-well voltage.

The data stored in the memory elements are read out by the column control circuit 204 and output to external I/O lines via data input/output buffer 212. Program data to be stored in the memory elements is input to the data input/output buffer 212 via the external I/O lines, and transferred to the column control circuit 204. The external I/O lines are connected to a controller 218.

Command data for controlling the flash memory device is input to the controller 218. The command data informs the flash memory of what operation is requested. The input command is transferred to the state machine 216, which controls the column control circuit 204, the row control circuit 206, the c-source control 210, the p-well control circuit 208 and the data input/output buffer 212. The state machine 216 can also output status data of the flash memory such as READY/BUSY or PASS/FAIL. In some designs, state machine 216 is responsible for managing the programming process, including the processes depicted in the flow charts described below.

The controller 218 is connected or connectable with a host system such as a personal computer, a digital camera, personal digital assistant, etc. The controller 218 communicates with the host in order to receive commands and data from the host, and provide data and status information to the host. The controller 218 converts commands from the host into command signals that can be interpreted and executed by command circuits 214, which are in communication with the state machine 216. Controller 218 typically contains buffer memory for the user data being written to, or read from, the memory array. In some designs, the programming process can be managed by the controller.

One example memory system comprises one integrated circuit that includes controller 218, and one or more integrated circuit chips that each contains a memory array and associated control, input/output and state machine circuits. The trend is to integrate the memory arrays and controller circuits of a system together on one or more integrated circuit chips. The memory system may be embedded as part of the host system, or may be included in a memory card (or other package) that is removably inserted into the host systems. Such a removable card may include the entire memory system (e.g., including the controller) or just the memory array(s) and associated peripheral circuits (with the controller being embedded in the host). Thus, the controller (or control capability) can be embedded in the host or included within a removable memory system.

In some implementations, some of the components of FIG. 5 can be combined. In various designs, one or more of the components of FIG. 5, other than memory element array 202, can be thought of as a managing circuit. For example, one or more managing circuits may include any one of, or a combination of, a command circuit, a state machine, a row control circuit, a column control circuit, a well control circuit, a source control circuit or a data I/O circuit.

Figure 6:
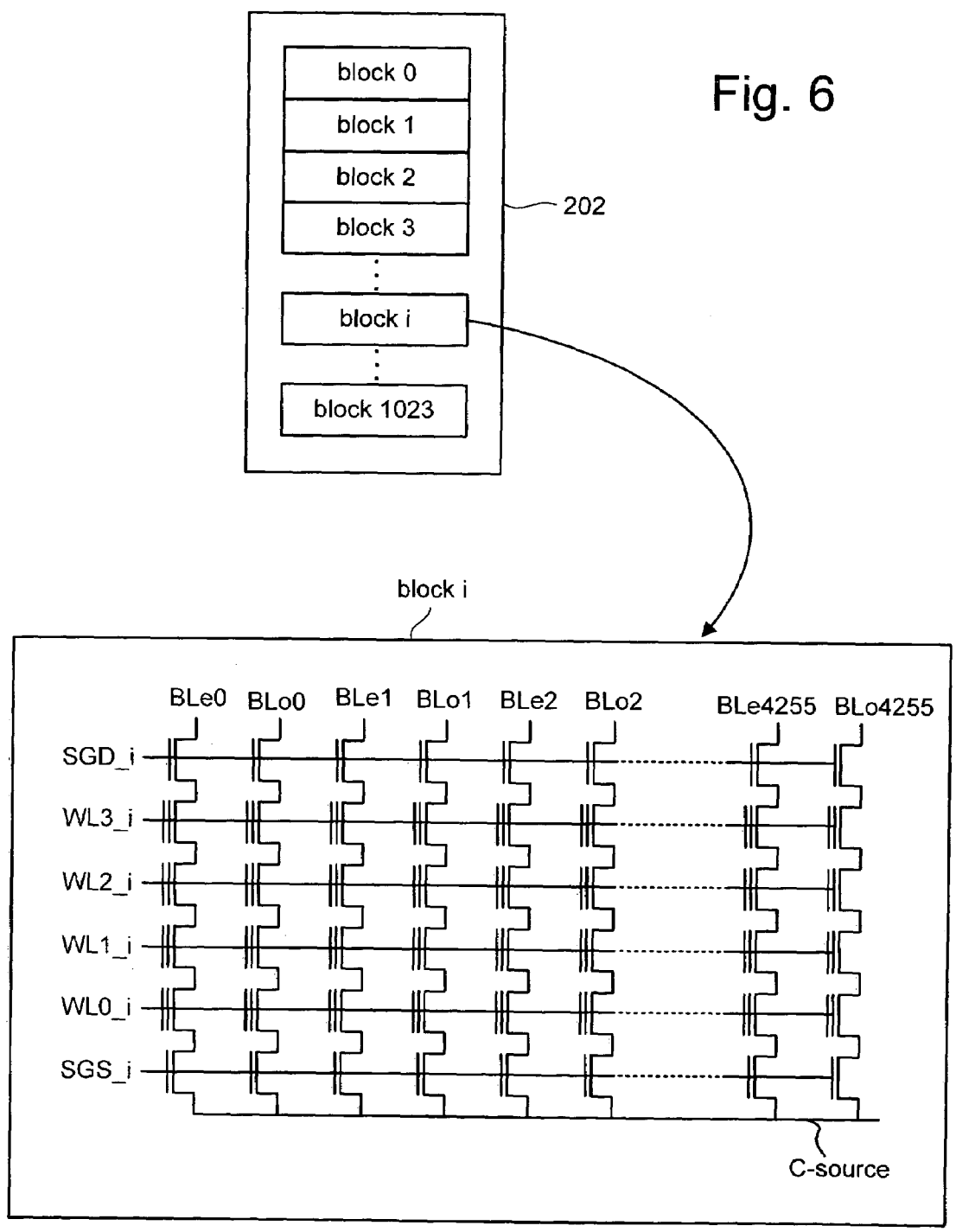
FIG. 6 is a block diagram of a non-volatile memory array.

FIG. 6 provides an example structure of memory element array 202. As one example, a NAND flash EEPROM is described that is partitioned into 1,024 blocks. In an erase operation, the data stored in each block is simultaneously erased. In one design, the block is the minimum unit of elements that are simultaneously erased. In each block, in this example, there are 8,512 columns that are divided into even columns and odd columns. The bit lines are also divided into even bit lines (BLe) and odd bit lines (BLo). FIG. 6 shows four memory elements connected in series to form a NAND string. Although four elements are shown to be included in each NAND string, more or less than four memory elements can be used. One terminal of the NAND string is connected to a corresponding bit line via a select transistor SGD, and another terminal is connected to the c-source line via a second select transistor SGS.

During one configuration of read and programming operations, 4,256 memory elements are simultaneously selected. The memory elements selected have the same word line and the same kind of bit line (e.g., even bit lines or odd bit lines). Therefore, 532 bytes of data, which form a logical page, can be read or programmed simultaneously, and one block of the memory can store at least eight logical pages (four word lines, each with odd and even pages). For multi-state memory elements, when each memory element stores two bits of data, where each of these two bits are stored in a different page, one block stores sixteen logical pages. Other sized blocks and pages can also be used with the present invention. Additionally, architectures other than those of FIGS. 5 and 6 can also be used to implement the present invention. For example, in one design, the bit lines are not divided into odd and even bit lines so that all bit lines can be programmed and read concurrently (or not concurrently).

Memory elements can be erased by raising the p-well to an erase voltage (e.g., 20 V) and grounding the word lines of a selected block. The source and bit lines are floating. Erasing can be performed on the entire memory array, separate blocks, or another unit of the memory elements which is a portion of the memory device. Electrons are transferred from the floating gate to the p-well region so that the threshold voltage becomes negative, in one possible approach.

In the read and verify operations, the select gates (SGD and SGS) and the unselected word lines (e.g., WL0, WL2 and WL3, when WL1 is the selected word line) are raised to a read pass voltage (e.g., 4.5 V) to make the transistors operate as pass gates. The selected word line WL1 is connected to a voltage, a level of which is specified for each read and verify operation in order to determine whether a threshold voltage of the concerned memory element is above or below such level. For example, in a read operation for a two-level memory element, the selected word line WL1 may be grounded, so that it is detected whether the threshold voltage is higher than 0 V. In a verify operation for a two level memory element, the selected word line WL1 is connected to 0.8 V, for example, so that it is verified whether or not the threshold voltage has reached at least 0.8 V. The source and p-well are at 0 V. The selected bit lines, assumed to be the even bit lines (BLe), are pre-charged to a level of, for example, 0.7 V. If the threshold voltage is higher than the read or verify level on the word line, the potential level of the bit line (BLe) associated with the element of interest maintains the high level because of the non-conductive memory element. On the other hand, if the threshold voltage is lower than the read or verify level, the potential level of the concerned bit line (BLe) decreases to a low level, for example, less than 0.5 V, because the conductive memory element discharges the bit line. The state of the memory element can thereby be detected by a voltage comparator sense amplifier that is connected to the bit line.

The erase, read and verify operations described above are performed according to techniques known in the art. Thus, many of the details explained can be varied by one skilled in the art. Other erase, read and verify techniques known in the art can also be used.

As described above, each block can be divided into a number of pages. In one approach, a page is a unit of programming. In some implementations, the individual pages may be divided into segments and the segments may contain the fewest number of elements that are written at one time as a basic programming operation. One or more pages of data are typically stored in one row of memory elements. A page can store one or more sectors. A sector includes user data and overhead data, such as an Error Correction Code (ECC) that has been calculated from the user data of the sector. A portion of the controller calculates the ECC when data is being programmed into the array, and also checks the data using the ECC when the data is read from the array. Alternatively, the ECCs and/or other overhead data are stored in different pages, or even different blocks, than the user data to which they pertain. In other designs, other parts of the memory device, such as the state machine, can calculate the ECC.

A sector of user data is typically 512 bytes, corresponding to the size of a sector in magnetic disk drives. Overhead data is typically an additional 16–20 bytes. A large number of pages form a block that includes anywhere from 8 pages, for example, up to 32, 64 or more pages.

Figure 7:
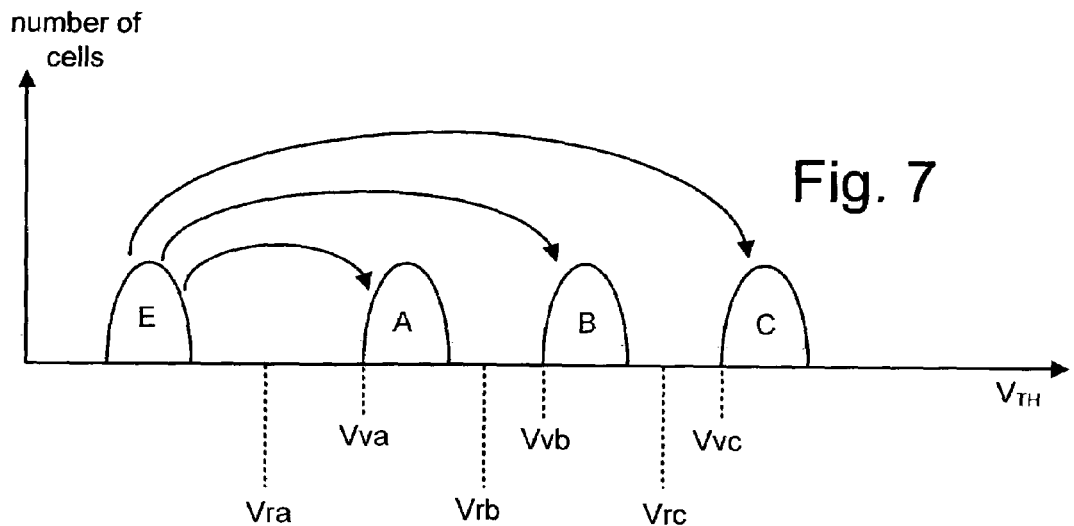
FIG. 7 depicts an example set of threshold voltage distributions in a multi-state device with direct programming from the erased state to a programmed state.

FIG. 7 illustrates threshold voltage distributions for the memory element array when each memory element stores two bits of data. E depicts a first threshold voltage distribution for erased memory elements. A, B and C depict three threshold voltage distributions for programmed memory elements. In one design, the threshold voltages in the E distribution are negative and the threshold voltages in the A, B and C distributions are positive.

Each distinct threshold voltage range of FIG. 7 corresponds to predetermined values for the set of data bits. The specific relationship between the data programmed into the memory element and the threshold voltage levels of the element depends upon the data encoding scheme adopted for the elements. One example assigns "11" to the threshold voltage range E (state E), "10" to the threshold voltage range A (state A), "00" to the threshold voltage range B (state B) and "01" to the threshold voltage range C (state C). However, in other designs, other schemes are used.

FIG. 7 also shows three read reference voltages, Vra, Vrb and Vrc, for reading data from memory elements. By testing whether the threshold voltage of a given memory element is above or below Vra, Vrb and Vrc, the system can determine the state of the memory element. FIG. 7 also shows three verify reference voltages, Vva, Vvb and Vvc. When programming memory elements to state A, B or C, the system will test whether those memory elements have a threshold voltage greater than or equal to Vva, Vvb or Vvc, respectively.

In one approach, known as full sequence programming, memory elements can be programmed from the erase state E directly to any of the programmed states A, B or C (as depicted by the curved arrows). For example, a population of memory elements to be programmed may first be erased so that all memory elements in the population are in the erased state E. While some memory elements are being programmed from state E to state A, other memory elements are being programmed from state E to state B and/or from state E to state C.

Figure 8:
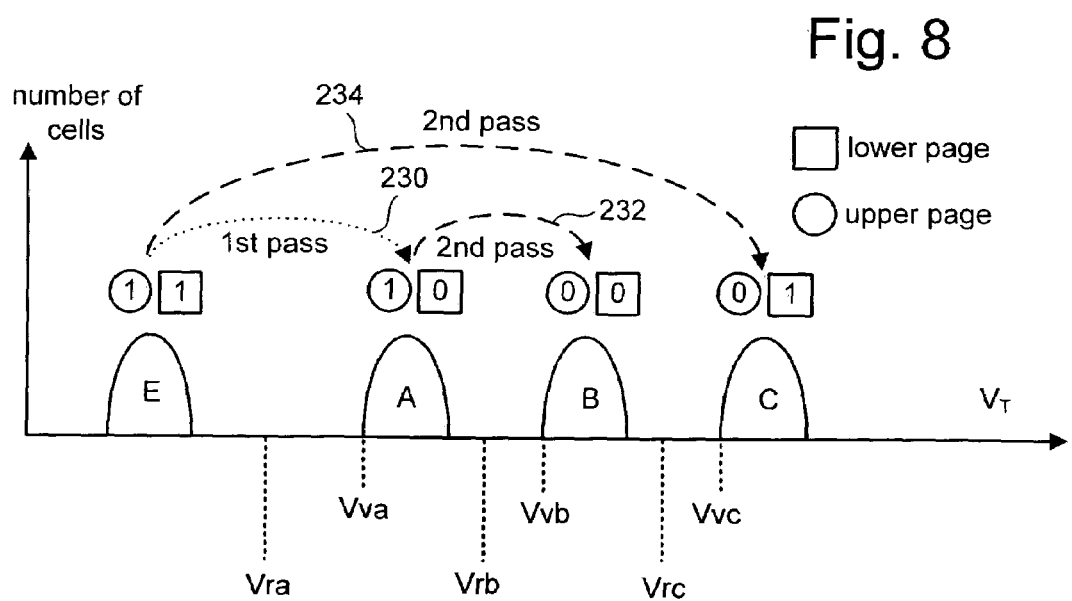
FIG. 8 depicts an example set of threshold voltage distributions in a multi-state device with two-pass programming from the erased state to a programmed state.

FIG. 8 illustrates an example of a two-pass technique of programming a multi-state memory element that stores data for two different pages: a lower page and an upper page. Four states are depicted: state E (11), state A (10), state B (00) and state C (01). For state E, both pages store a "1." For state A, the lower page stores a "0" and the upper page stores a "1." For state B, both pages store "0." For state C, the lower page stores "1" and the upper page stores "0." Note that although specific bit patterns have been assigned to each of the states, different bit patterns may also be assigned. In a first programming pass, the element's threshold voltage level is set according to the bit to be programmed into the lower logical page. If that bit is a logic "1," the threshold voltage is not changed since it is in the appropriate state as a result of having been earlier erased. However, if the bit to be programmed is a logic "0," the threshold level of the element is increased to be state A, as shown by arrow 230. That concludes the first programming pass.

In a second programming pass, the element's threshold voltage level is set according to the bit being programmed into the upper logical page. If the upper logical page bit is to store a logic "1," then no programming occurs since the element is in one of the states E or A, depending upon the programming of the lower page bit, both of which carry an upper page bit of "1." If the upper page bit is to be a logic "0," then the threshold voltage is shifted. If the first pass resulted in the element remaining in the erased state E, then in the second phase the element is programmed so that the threshold voltage is increased to be within state C, as depicted by arrow 234. If the element had been programmed into state A as a result of the first programming pass, then the memory element is further programmed in the second pass so that the threshold voltage is increased to be within state B, as depicted by arrow 232. The result of the second pass is to program the element into the state designated to store a logic "0" for the upper page without changing the data for the lower page.

In one approach, a system can be set up to perform full sequence writing if enough data is written to fill up an entire page. If not enough data is written for a full page, then the programming process can program the lower page with the data received. When subsequent data is received, the system will then program the upper page. In yet another approach, the system can start writing in the mode that programs the lower page and convert to full sequence programming mode if enough data is subsequently received to fill up all, or most of, a word line's memory elements. More details of such an approach are disclosed in U.S. patent Application titled "Pipelined Programming of Non-Volatile Memories Using Early Data," Ser. No. 11/013,125, filed on Dec. 14, 2004 by inventors Sergy Anatolievich Gorobets and Yan Li, incorporated herein by reference in its entirety.

Figure 9A:
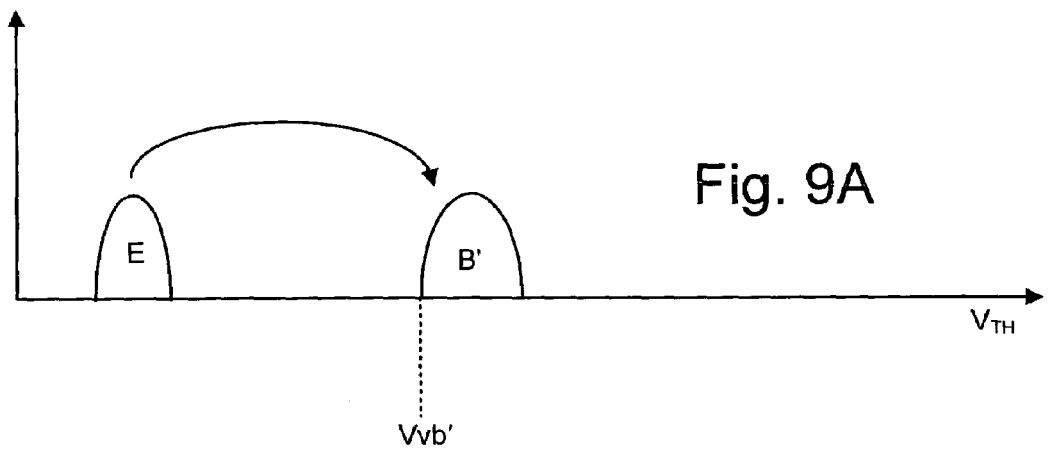
FIGS. 9A–C show various threshold voltage distributions and describe a process for programming non-volatile memory.
Figure 9B:
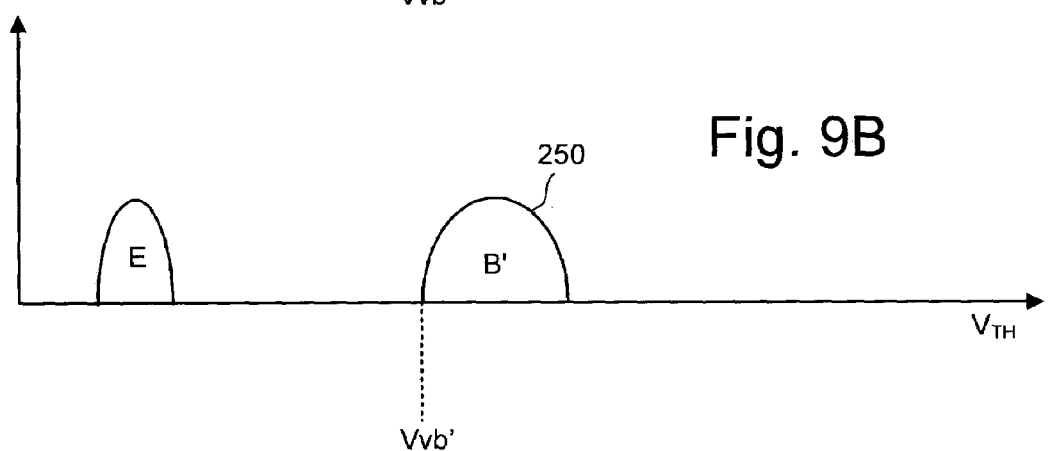
Figure 9C:
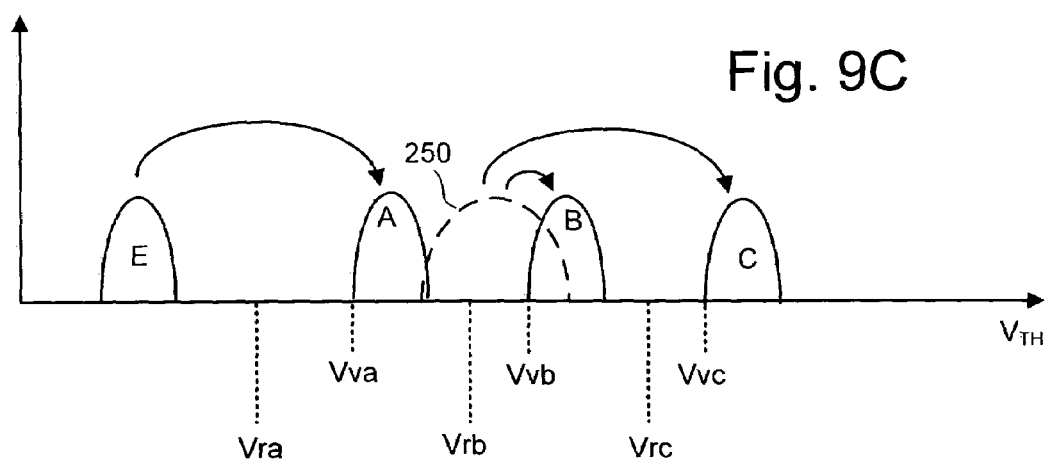

FIGS. 9A–C disclose another process for programming non-volatile memory that reduces floating gate-to-floating gate coupling by, for any particular memory element, writing to that particular memory element with respect to a particular page subsequent to writing to adjacent memory elements for previous pages. In one example implementation, each of the non-volatile memory elements store two bits of data, using four data states. For example, assume that state E is the erased state and states A, B and C are the programmed states. State E stores data 11, state A stores data 01, state B stores data 10 and state C stores data 00. This is an example of non-Gray coding because both bits change between adjacent states A and B. Other encodings of data to physical data states can also be used. Each memory element stores bits from two pages of data. For reference purposes these pages of data will be called upper page and lower page; however, they can be given other labels. With reference to state A for the process of FIGS. 9A–C, the upper page stores bit 0 and the lower page stores bit 1. With reference to state B, the upper page stores bit 1 and the lower page stores bit 0. With reference to state C, both pages store bit data 0. The programming process of FIGS. 9A–C is a two-step process. In the first step, the lower page is programmed. If the lower page is to remain data 1, then the memory element state remains at state E. If the data is to be programmed to 0, then the voltage threshold $V_{TH}$ of the memory element is raised such that the memory element is programmed to state B'. FIG. 9A therefore shows the programming of memory elements from state E to state B'. State B' depicted in FIG. 9A represents an interim state B; therefore, the verify point is depicted as Vvb', which is lower than Vvb, depicted in FIG. 9C.

In one design, after a memory element is programmed from state E to state B', its neighbor memory element on an adjacent word line will then be programmed with respect to its lower page. After programming the neighbor memory element, the floating gate-to-floating gate coupling effect will raise the apparent threshold voltage of memory element under consideration, which is in state B'. This will have the effect of widening the threshold voltage distribution for state B' to that depicted as threshold voltage distribution 250 of FIG. 9B. This apparent widening of the threshold voltage distribution will be remedied when programming the upper page.

FIG. 9C depicts the process of programming the upper page. If the memory element is in erased state E and the upper page is to remain at 1, then the memory element will remain in state E. If the memory element is in state E and its upper page data is to be programmed to 0, then the threshold voltage of the memory element will be raised so that the memory element is in state A. If the memory element is in state B' with the intermediate threshold voltage distribution 250 and the upper page data is to remain at 1, then the memory element will be programmed to final state B. If the memory element is in state B' with the intermediate threshold voltage distribution 250 and the upper page data is to become data 0, then the threshold voltage of the memory element will be raised so that the memory element is in state C. The process depicted by FIGS. 9A–C reduces the effect of floating gate-to-floating gate coupling because only the upper page programming of neighbor memory elements will have an effect on the apparent threshold voltage of a given memory element. An example of an alternate state coding is to move from distribution 250 to state C when the upper page data is a 1, and to move to state B when the upper page data is a 0. Although FIGS. 9A–C provide an example with respect to four data states and two pages of data, the concepts taught can be applied to other implementations with more or less than four states and different than two pages. More detail about various programming schemes and floating gate-to-floating gate coupling can be found in U.S. patent application Ser. No. 11/099,133, titled "Compensating For Coupling During Read Operations Of Non-Volatile Memory," filed on Apr. 5, 2005.

Figures 1, 10:
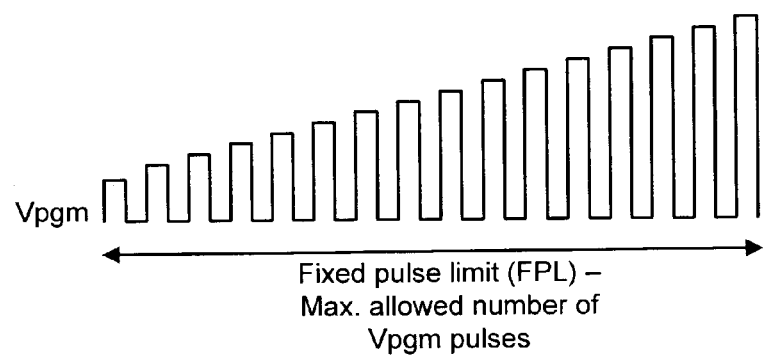
FIG. 1 depicts one example of a program voltage that can be applied to one or more control gates of flash memory devices.
FIG. 10 is a chart describing programming performance.

FIG. 10 provides a table that describes examples of performance during programming of non-volatile memory. Data is provided for fresh (unused) devices and devices that have performed 10,000 programming cycles. In one approach, a programming cycle includes the actions of programming and erasing (or erasing and then programming). In other approaches, the programming cycle can include programming without erasing. The table shows how many voltage programming pulses ($V_{pgm}$) are used to program data into the lower pages and upper pages according to the method described above with respect to FIG. 8. There is also data regarding performing full sequence programming according to the method described with respect to FIG. 7. In both cases, the magnitude of the initial pulse is 16.0 V and the step size is 0.3 V. As depicted in FIG. 10, the average programming times for fresh and used devices are 800 μsec and 650 μsec, respectively. Fresh devices required approximately three more programming pulses than cycled devices. In addition, fresh devices required more program pulses during the soft programming process (described below).

To avoid applying an excessive number of program pulses to the normal cells or elements in a cycled device without increasing the risk of reducing die-sort yield, it is proposed to adaptively adjust the maximum allowable number of programming pulses which may be applied to a memory element before the memory element is declared to be errored. In this way, the maximum allowable number of programming pulses can be gradually adjusted over time as the device is cycled.

Figure 11:
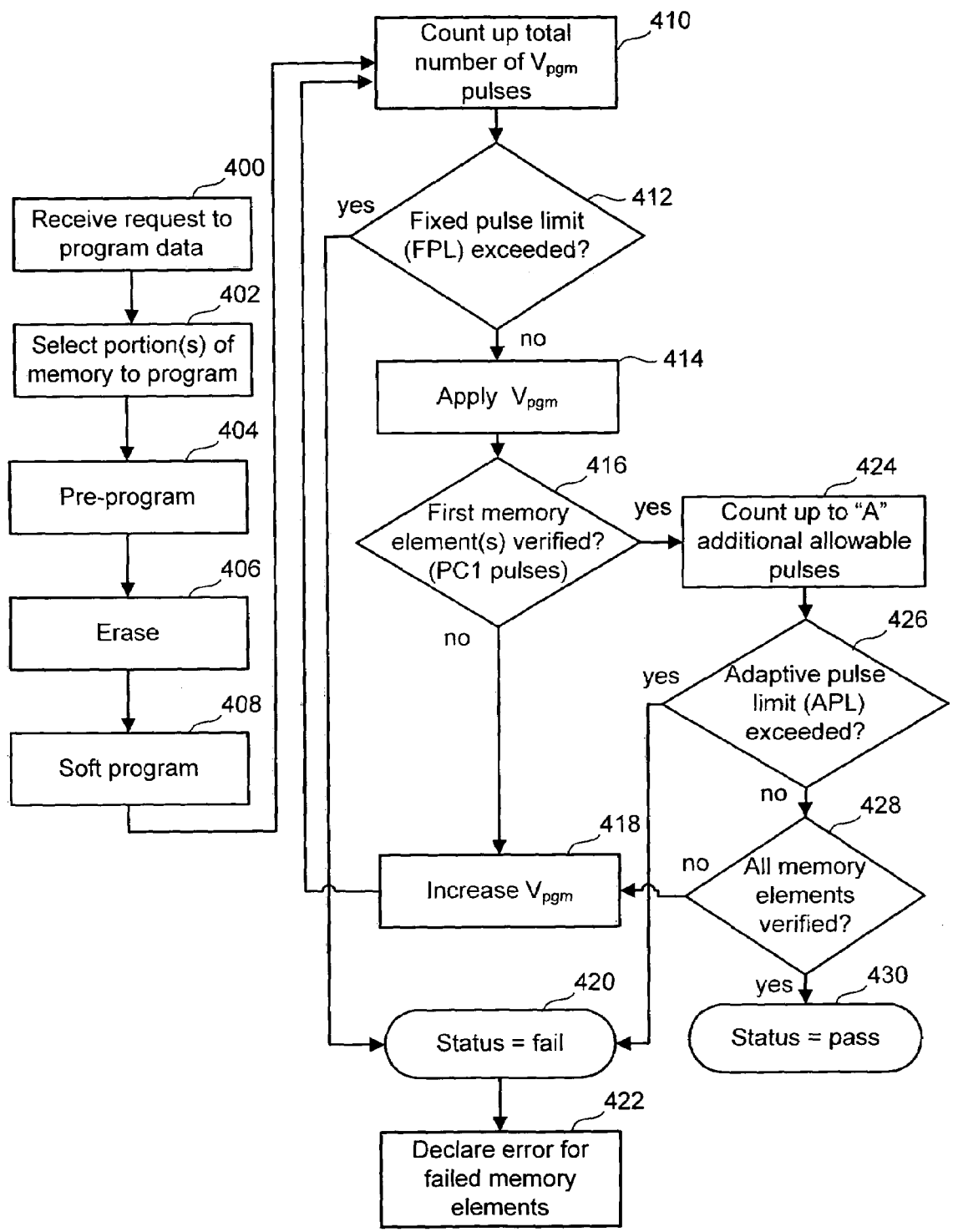
FIG. 11 is a flow chart describing a process for programming non-volatile storage while adaptively adjusting the maximum allowable number of programming pulses which may be applied to a memory element before the memory element is declared to be errored.

FIG. 11 is a flow chart describing a process for programming non-volatile storage while adaptively adjusting the maximum allowable number of programming pulses which may be applied to a memory element before the memory element is declared to be errored. The process can be initiated in response to receiving a request to program data (step 400). In step 402, the system selects the appropriate portions of memory to program. This may include selecting a block and/or page and/or sector to write to. Optionally, a cycle count, which is a count of the number of programming cycles, can be incremented. The cycle count can be stored in the flash memory array, the state machine, the controller, or another location. In one approach, the cycle count is stored in a register associated with the state machine. At step 404, the selected portion of memory is optionally pre-programmed, which provides for even wearing of the memory. All memory elements in the chosen sector or page are programmed to the same threshold voltage range. At step 406, all the memory elements to be programmed are then erased. For example, step 406 can include moving all memory elements to state E (see FIGS. 7–9). During the erase process, it is possible that some of the memory elements have their threshold voltages lowered to a value that is below the distribution E (see FIGS. 7–9). At step 408, the system performs a soft programming process, such as by applying program voltage pulses similar to those shown in FIG. 1 to the memory elements so that their threshold voltages will increase to be within the threshold voltage distribution E.

Optionally, the system may access a flag that indicates the magnitude of an initial program pulse. Referring to FIG. 10, for example, the initial value of $V_{pgm}$ may be 16.0 V. The initial value of $V_{pgm}$ can be set by properly programming the charge pump. At step 410, a count of the total number of applied voltage pulses, or program count PC, is initially set to zero and counted up for each pass. At step 412, a check is made to determine if a fixed pulse limit (FPL) has been exceeded. See also FIG. 1 regarding the FPL. For example, an FPL such as twenty four pulses may be used. This limit on the number of pulses applied is optionally maintained in addition to the adaptive pulse limit (APL), described below, which is normally lower. In step 414, a program pulse $V_{pgm}$ is applied to the appropriate word line(s). In step 416, the memory elements on that word line(s) are verified to see if any of the memory elements have reached an associated target threshold voltage level. That is, it may be determined whether a subset of the memory elements, which includes one or more memory elements, has been verified. The verify level can be, e.g., a final voltage level to which the non-volatile storage elements are to be programmed, or an intermediate voltage level which is before the final voltage level. Moreover, the verify levels need not be the same for all memory elements. See FIG. 12 for further details.

If none of the memory elements has been verified, $V_{pgm}$ is increased at step 418 and an additional pass or programming loop begins at step 410 as the next program pulse is applied, as long as the fixed pulse limit has not been exceeded. The process described is repeated until at least one of the memory elements has been verified. Note that the magnitude of $V_{pgm}$ can be incremented by a fixed or varying step size (e.g., 0.3 V), or no incrementing is needed when pulses of equal magnitude are used. Once the first memory element or elements has been verified to meet a specified threshold voltage level at step 416, a count of additional voltage pulses begins at step 424. The specified number of additional pulses "A" can be applied to allow the remaining memory elements to reach the verify level, thereby adaptively setting the total number of pulses applied to the elements. In one embodiment, "A" can be equal to the natural threshold voltage distribution of a page or other group of non-volatile storage elements divided by a step size of the stepped voltage pulses. In other embodiments, the number of additional pulses can be determined by device characterization or other means.

Moreover, it is not necessary to count the number of pulses needed for the first memory element(s) to reach the verify level since the number of additional pulses applied can be counted once the verification of the first memory element(s) is detected. For example, the first memory element may reach the verify level after eight pulses, and the number of additional pulses allowed "A" may be six pulses. The adaptive pulse limit (APL), which is the total number of pulses which may be applied, is therefore limited to fourteen in this example, which is below the FPL of twenty four pulses. In this case, the counter need only count up to six to enforce the APL. This approach provides a streamlined design which minimizes processing overhead. Thus, the APL may be enforced by starting a separate counter after the first memory element has been verified, to determine when the maximum allowable number of additional pulses ("A") have been applied to the remaining memory elements to allow them to also reach the desired verify level. In another approach, the pulse count (PC1) when the first memory element is verified can be recorded and summed with the maximum allowable number of additional pulses ("A") to obtain the adaptive pulse limit (APL) by the formula APL=PC1+A. A single counter which tracks the total number of pulses can then be used to determine when the APL is reached. See FIGS. 13 and 14 and the related discussion, further below, for an additional explanation of the relationship between these values.

At step 426, a check is made to determine whether the adaptive pulse limit (APL) has been exceeded. If the limit has been exceeded, all six additional pulses have already been applied, in the present example, prior to all elements being verified. In this case, the programming process has failed, and a fail status is set at step 420. Additionally, an error is declared for the specific failed memory elements at step 422. If the adaptive limit has not been exceeded at step 426, a check is made at step 428 as to whether all the memory elements have been verified to have reached their target threshold voltage level. If all elements have been verified, then the programming process has completed successfully, as indicated by "status=pass" in step 430. If not all elements have been verified at step 428, $V_{pgm}$ is increased and an additional loop begins at step 410. Thus, the process described is repeated until the APL is exceeded, all memory elements are verified, or the FPL is exceeded, whichever comes first. Note that the memory elements that have reached their target threshold voltage are locked out of programming for the remainder of the current programming cycle. The entire process of FIG. 11 can be repeated when a subsequent request to program additional data, such as additional blocks, pages or sectors of data, is received.

The process of FIG. 11 can be modified in several ways. For example, separate fixed and adaptive pulse count limits may be maintained for different portions of the memory, e.g., blocks or segments, in which data is being programmed. Generally, separate values may be maintained for different portions of the memory that are subject to different degradation rates.

Moreover, it is possible to modify step 416 by determining when a number of memory elements, such as a defined portion of all memory elements, e.g., 10%, have been verified. In this case, a statistical metric such as an average or mean of the pulse count values can be obtained as the value PC1 which is summed with the limit on the additional pulses "A" to obtain the APL. Such a value is representative of a plurality of the fastest programming elements in the memory device rather than being representative of the single fastest element. Some additional complexity is added in that appropriate control circuitry is needed to record and process the multiple pulse count values. The APL can then be enforced against the remaining elements in the same programming cycle, and/or in one or more subsequent programming cycles. It is also possible to determine the pulse count for every verified element, and derive a representative PC, in which case the resulting APL can be enforced in one or more subsequent programming cycles. Additionally, a moving average or mean of PC1 taken over a number of programming cycles can be used to derive an APL that can be enforced in one or more subsequent programming cycles. The metric used may further include weighting, e.g., so that more recent values of PC1 are accorded a higher weight.

Moreover, rules may be imposed regarding the maximum change in APL each time it is calculated. For instance, a rule may be imposed so that APL does not change by more than one pulse count each time it is calculated. Smoothing out variations in APL can avoid abrupt changes that affect performance. Additionally, a rule may be imposed so that APL is only adjusted in one direction, such as downward, to avoid anomalous results.

Furthermore, while FIG. 11 indicates that the APL is calculated for each programming cycle, it is possible to calculate a new APL only in specified programming cycles and to carry over the value to be enforced in subsequent cycles until it is calculated again. In particular, it is expected that the number of programming pulses needed for the first element to verify, PC1, and, correspondingly, APL, will gradually trend downward over time, after hundreds or thousands of programming cycles. Accordingly, it may be sufficient to calculate APL after every n programming cycles, where n=50 or 100, for instance. Or, APL may be calculated after a specified number of programming cycles, such as after 500, 1000, 1250, 1500 programming cycles, and so forth. Further, the increments may be fixed or variable. For example, experimental or theoretical data may be used to obtain a profile of the decrease in the number of programming pulses needed, on average, to program the memory elements, relative to the number of programming cycles. The times for calculating APL can be chosen accordingly so it is calculated more frequently when it is expected that the number of programming pulses needed will change more rapidly.

Regarding "A", the maximum additional number of pulses used to accommodate different programming performance characteristics of the different memory elements, this value should be set large enough so that the number of elements which remain unverified after "A" additional pulses are applied is not excessive, yet the value should be small enough so that the overall programming time and total number of pulses used in the memory is not excessive. In one approach, a value of about six pulses can be used. Moreover, "A" can be a fixed or variable value. For example, "A" can vary as a function of a parameter such as the number of pulses needed for one or more memory elements to program, PC1. In this case, a larger value of "A" is used when PC1 is larger, and a smaller value is used when PC1 is smaller. A table may be implemented where different ranges of PC1 are correlated with different values of "A". For example, for PC1=1–10, "A"=5; for PC1=11–15, "A"=6; for PC1=16–20, "A"=7 and for PC1=21–24, "A"=8. Or, "A" may be calculated as a portion of PC1, such as a fraction or percentage, e.g., 50%, and rounded to the nearest whole number. Rounding up to the next highest whole number may be used. For example, for PC1=15, "A"=8.

In another approach, "A" can be set based on a usage of the memory elements, such as determined by the number (N) of programming cycles which the memory has experienced. For example, for N=1–1,000, "A"=8; for N=1,001–5,000, "A"=7 and for N=5,001–10,000, "A"=6. "A" can also be set based on both PC1 and the number of programming cycles. In any case, "A" decreases as PC1 and/or the number of programming cycles decreases over time. Note that separate values of "A" may be maintained for different portions of the memory, such as the memory elements that store data from upper and lower pages, in correspondence with the separate APL values which may be maintained, as discussed above. The values FPL, APL and "A" can also be set based on the type of programming used, e.g., page mode programming versus full sequence programming.

Figure 12:
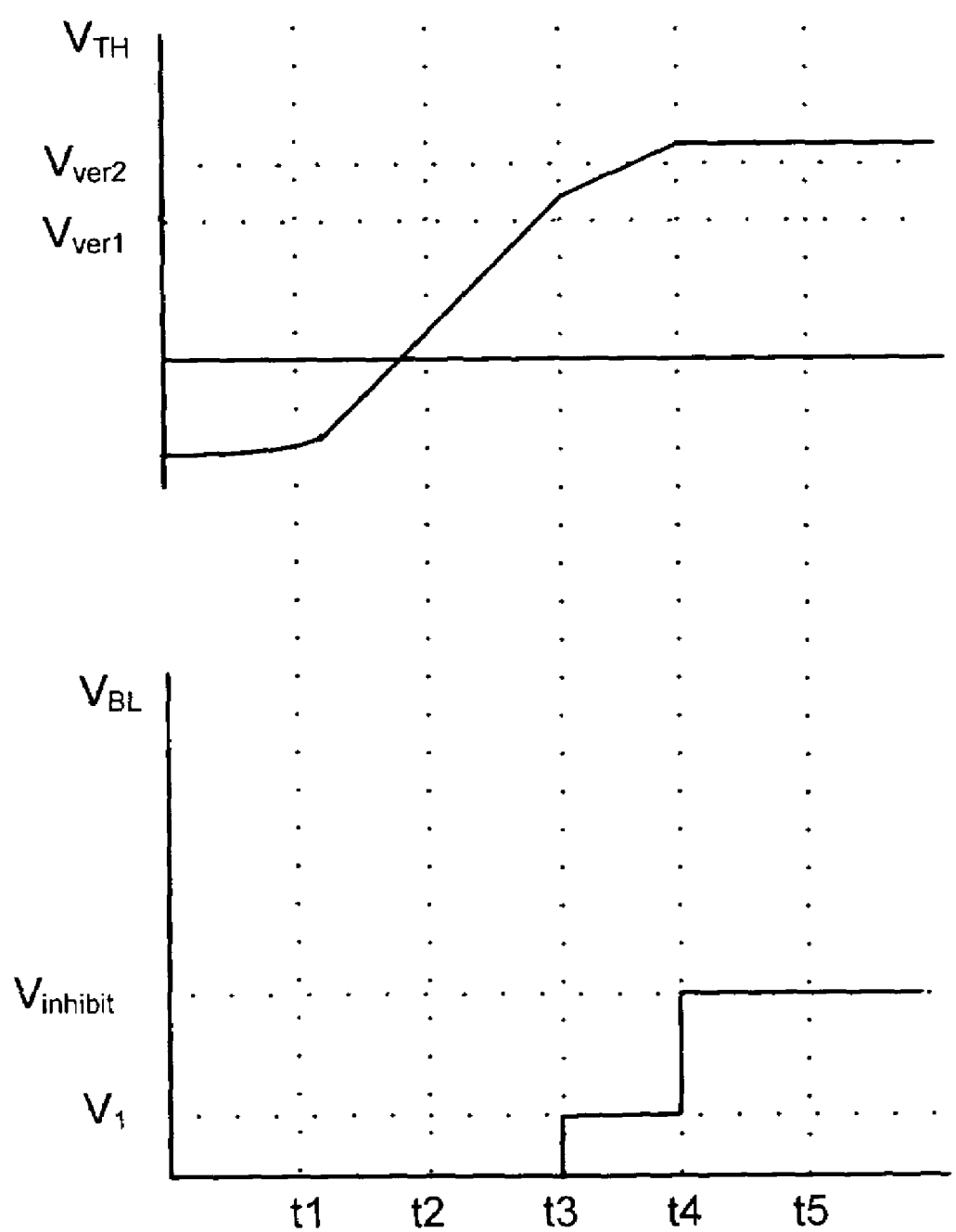
FIG. 12 depicts graphs of threshold voltage ($V_{TH}$) versus time and bit line voltage ($V_{BL}$) versus time.

FIG. 12 depicts graphs of threshold voltage ($V_{TH}$) versus time and bit line voltage ($V_{BL}$) versus time. As mentioned above in connection with FIG. 11 (step 416), the programming process includes verifying whether memory elements have reached an associated target threshold voltage level, where the verify level can be, e.g., a final voltage level to which the non-volatile storage elements are to be programmed, or an intermediate voltage level which is before the final voltage level.

The process of FIG. 12 represents a coarse/fine programming process. The program voltage $V_{pgm}$ is applied to the control gates of the memory elements to be programmed. Between the program pulses, verify operations are performed. In one embodiment, a first, intermediate verify level, $V_{ver1}$, and a second, final verify level, $V_{ver2}$, are defined. As mentioned, the verify levels can be different for different memory elements or groups of memory elements. Moreover, it is possible to have more than two verify levels for the same memory element or group of memory elements. If the threshold voltage $V_{TH}$ of the memory element being programmed is less than $V_{ver1}$, the programming continues in a coarse mode for that element with the bit line voltage remaining low (e.g., 0 V). When $V_{TH}$ reaches $V_{ver1}$ but is less than $V_{ver2}$, e.g., at time t3, then an intermediate bit line voltage (e.g., 1 V) is applied. As a result of the intermediate bit line voltage, the channel voltage will increase (e.g., 1 V) and the programming of that memory element will be slowed down, thereby transitioning to a fine programming mode, because the shift in $V_{TH}$ due to each subsequent program pulse will be reduced. The bit line will remain at the intermediate bit line voltage for a number of pulses until $V_{TH}$ reaches the final target verify level, $V_{ver2}$, e.g., at time t5, after which the bit line will be raised to inhibit further programming, such as by raising the bit line voltage to $V_{inhibit}$, which, for example, could be $V_{dd}$.

With this approach, a narrower programmed threshold voltage distribution can be achieved relative to the case where a single verify level is used because the shift per pulse of the threshold voltage is reduced once the threshold voltage is close to the target value (e.g., when the threshold voltage is above $V_{ver1}$ and below $V_{ver2}$). However, the intermediate bit line bias slows down the programming of the memory cells so that overall programming time can increase. Multiple additional pulses (e.g., typically, two to three pulses) may be needed to finish the programming process.

Figure 13:
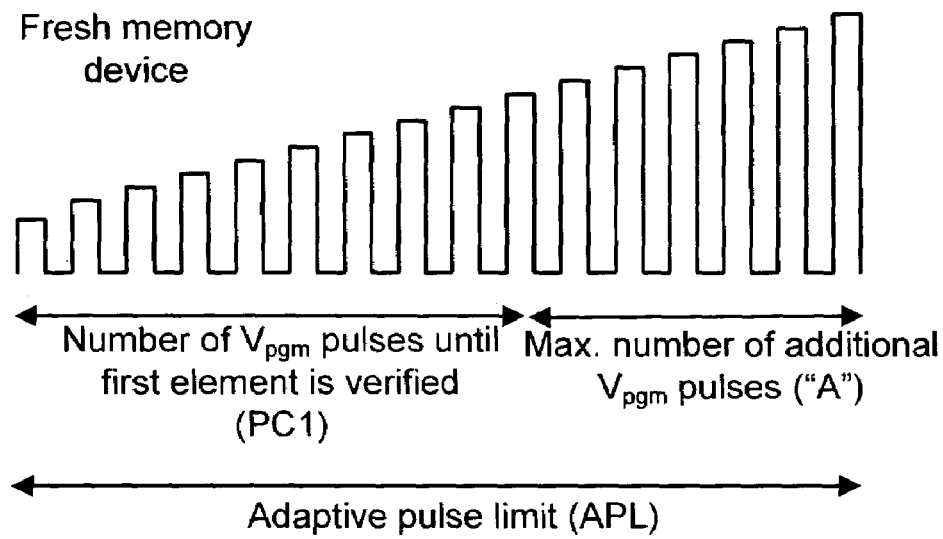
FIG. 13 depicts programming pulses applied to a fresh memory device.
Figure 14:
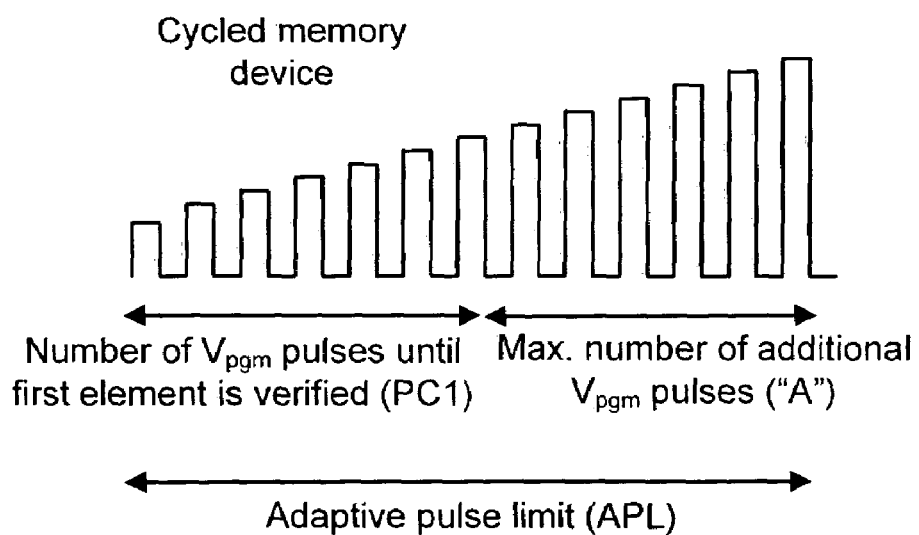
FIG. 14 depicts programming pulses applied to a cycled memory device.

FIG. 13 depicts programming pulses applied to a fresh memory device, while FIG. 14 depicts programming pulses applied to a cycled memory device. As mentioned, as a non-volatile memory device undergoes many programming cycles, charge becomes trapped in the insulation between the floating gate and the channel region. This trapping of charge shifts the threshold voltage to a higher level, which allows the memory element to program quicker so that fewer voltage pulses are needed for the element to reach a desired voltage level. Comparing FIG. 13 to FIG. 14, it can be seen that the number of $V_{pgm}$ pulses (PC1) applied to a memory until the first element is verified is reduced for the cycled memory. Furthermore, in the example shown, the maximum allowable number of additional programming pulses "A" is the same for both the fresh and cycled memory devices. The adaptive pulse limit (APL) is accordingly also reduced for the cycled device.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. A non-volatile storage system, comprising:
non-volatile storage elements; and
one or more circuits detecting when at least a first of the non-volatile storage elements has been programmed to an associated desired programming state using voltage pulses, and, responsive to the detecting, adaptively adjusting a maximum allowable number of voltage pulses to be used in programming at least a second of the non-volatile storage elements to an associated desired programming state.

2. The non-volatile storage system of claim 1, wherein:
the associated desired programming states of the at least a first non-volatile storage element and the at least a second non-volatile storage element are the same.

3. The non-volatile storage system of claim 1, wherein:
the associated desired programming states of the at least a first non-volatile storage element and the at least a second non-volatile storage element differ.

4. The non-volatile storage system of claim 1, wherein:
the maximum allowable number is set based on a portion of the non-volatile storage system in which the at least a first non-volatile storage element and the at least a second non-volatile storage element are provided.

5. The non-volatile storage system of claim 4, wherein:
the portion is at least one of a block and a segment.

6. The non-volatile storage system of claim 1, wherein:
the maximum allowable number is set based on a type of programming used in programming the non-volatile storage elements.

7. The non-volatile storage system of claim 6, wherein:
the type of programming is at least one of page mode programming and full sequence programming.

8. The non-volatile storage system of claim 1, wherein:
the maximum allowable number is set based on a degradation of the non-volatile storage elements.

9. The non-volatile storage system of claim 1, wherein:
the maximum allowable number is enforced in a programming cycle in which the at least a first non-volatile storage element has been programmed to its associated desired programming state.

10. The non-volatile storage system of claim 1, wherein:
the maximum allowable number is enforced in a programming cycle which is subsequent to a programming cycle in which the at least a first non-volatile storage element has been programmed to its associated desired programming state.

11. The non-volatile storage system of claim 1, wherein:
the one or more circuits track a usage of the non-volatile storage elements over time; and
the maximum allowable number is set based on the usage.

12. The non-volatile storage system of claim 11, wherein:
the usage is indicated by a number of programming cycles which the non-volatile storage elements have experienced.

13. A non-volatile storage system, comprising:
non-volatile storage elements; and
one or more circuits detecting, for each of a plurality of programming cycles, when one or more of the non-volatile storage elements have been programmed to associated desired programming states using voltage pulses, and adaptively adjusting, responsive to the detecting, a maximum allowable number of voltage pulses to be used in programming other ones of the non-volatile storage elements to associated desired programming states.

14. The non-volatile storage system of claim 13, wherein:
the maximum allowable number is determined based on a moving average or mean of a number of the voltage pulses used in each of the plurality of programming cycles.

15. The non-volatile storage system of claim 13, wherein:
the maximum allowable number is determined by according a higher weight to a number of the voltage pulses used in more recent programming cycles than in less recent programming cycles of the plurality of programming cycles.

16. The non-volatile storage system of claim 13, wherein:
the detecting is performed for successive programming cycles.

17. The non-volatile storage system of claim 13, wherein:
the detecting is performed for programming cycles which are separated from one another by specified increments.

18. The non-volatile storage system of claim 13, wherein:
the maximum allowable number is enforced in a programming cycle which follows the plurality of programming cycles.

19. A non-volatile storage system, comprising:
non-volatile storage elements; and
one or more circuits: (a) detecting when at least a first non-volatile storage element in a first subset of the non-volatile storage elements has been programmed to an associated desired programming state using voltage pulses, and, in response, adaptively adjusting a first maximum allowable number of voltage pulses to be used in programming at least a second non-volatile storage element in the first subset of non-volatile storage elements to an associated desired programming state, and (b) detecting when at least a first non-volatile storage element in a second subset of the non-volatile storage elements has been programmed to an associated desired programming state using voltage pulses, and, in response, adaptively adjusting a second maximum allowable number of voltage pulses to be used in programming at least a second non-volatile storage element in the second subset of non-volatile storage elements to an associated desired programming state.

20. The non-volatile storage system of claim 19, wherein: the first and second maximum allowable number of voltage pulses differ.

21. The non-volatile storage system of claim 19, wherein: the first and second subsets of non-volatile storage elements store data from upper and lower pages, respectively.

* * * * *